United States Patent [19]

Dolan et al.

[11] Patent Number: 5,103,225

[45] Date of Patent: Apr. 7, 1992

[54] MOTOR-DRIVEN POSITIONING SYSTEM WITH REFLECTIVE OPTICAL ENCODER

[75] Inventors: Donald T. Dolan, Ridgefield; Norman J. Bergman, Danbury, both of Conn.

[73] Assignee: Pitney Bowes Inc., Stamford, Conn.

[21] Appl. No.: 632,823

[22] Filed: Dec. 24, 1990

[51] Int. Cl.⁵ .............................. H03M 1/22
[52] U.S. Cl. .......................... 341/13; 318/439
[58] Field of Search ............. 341/3, 11, 13; 318/66, 318/70, 138, 254, 268, 439

[56] References Cited

U.S. PATENT DOCUMENTS

| | | | |
|---|---|---|---|
| 4,228,396 | 10/1980 | Palombo et al. | 324/163 |
| 4,591,774 | 5/1986 | Ferris et al. | 318/696 |
| 4,644,157 | 2/1987 | Ozawa et al. | 341/13 |
| 4,727,356 | 2/1988 | Abe et al. | 341/13 |
| 4,780,703 | 10/1988 | Ishida et al. | 341/6 |
| 4,978,847 | 12/1990 | Fukunaga et al. | 341/13 |
| 5,006,703 | 4/1991 | Shikunami et al. | 341/13 |

Primary Examiner—A. D. Pellinen
Assistant Examiner—Marc S. Hoff
Attorney, Agent, or Firm—Charles G. Parks, Jr.; David E. Pitchenik; Melvin J. Scolnick

[57] ABSTRACT

A low cost, high resolution optical encoder for a brushless DC motor comprises reflective sensors, and a movable disk cooperating with a stationary pattern to provide a pattern of reflective and non-reflective areas for the sensors that can be used to generate motor positional information as well as commutation drive signals.

13 Claims, 4 Drawing Sheets

MOVING DISK

STATIONARY PATTERN

MOTOR DRIVER PC BOARD

MOTOR-DRIVEN POSITIONING SYSTEM WITH REFLECTIVE OPTICAL ENCODER

RELATED APPLICATIONS

U.S. patent application, Ser. No. 423,330, filed Oct. 18, 1989, entitled "DUAL STAGE QUADRATURE INCREMENTAL ENCODER" (C-599);

U.S. patent application, Ser. No. 423,822, filed Oct. 18, 1989, entitled "MICROCOMPUTER-CONTROLLED ELECTRONIC POSTAGE METER HAVING PRINT WHEELS SET BY SEPARATE D.C. MOTORS" (C-596).

U.S. patent application Ser. No. 291,473, filed Dec. 28, 1988, entitled "DRIVER CIRCUITRY FOR MULTIPLE SENSORS" (C-440).

U.S patent application Ser. No. 291,092, filed Dec. 28, 1988, entitled "ENVELOPE FLAP PROFILING APPARATUS" (C-439).

BACKGROUND OF INVENTION

This invention relates to motor-driven positioning systems using optical encoders, and in particular to such systems using a brushless direct-current (DC) motor.

There are many systems employing motors for moving various objects. One example is described in the above-related applications, whose contents are hereby incorporated by reference, and relates to a postage meter system using five separate motors in a closed loop system for setting the digit printwheels simultaneously during postage value setting. Another example is a high-speed mail handling machine, which uses a plurality of motors for moving envelopes from a stack through a series of stations which shingle the envelopes, seal them, weigh them, stamp them with a postage meter mechanism, and then discharge them with or without sorting according to their destination. See, for instance, commonly owned U.S. Pat. No. 4,930,764. A related, also commonly-owned U.S. Pat. No. 4,935,078, describes how the various stations are coordinated to speed-up the processing. This requires the presence of motors that can be caused to follow accurate velocity profiles including starting at one particular time, ramping up to maximum velocity at a later particular time, maintaining that velocity for a certain time, then decelerating under controlled conditions, and finally stopping at a particular time and position. Such machines commonly employ microprocessor-controlled, closed loop systems with brushless DC motors using optical encoders both for positioning and for commutation. Appliance, November 1988, pages 88–92, and Machine Design, Aug. 11, 1988, pages 109–113, whose contents are hereby incorporated by reference, provide a complete description of current brushless DC motors, rotor-position sensors, stator-commutation logic, and the power driver circuitry required to operate such motors.

Present high resolution (greater than 100 cpr) optical encoders for such motors have disks whose slots are fabricated using optical/etching methods. A "U" shaped sensor is typically used where light is transmitted from an emitter on one side of the disk, through a pattern of spaced disk slots, to a detector on the opposite side of the disk. Quadrature output for sensing the direction of rotation of the motor is obtained by mounting in the sensor two separate emitter/detectors that are separated from each other by a distance that is modulo $\alpha/4$ mechanical degrees along the disk encoder track circumference, that is $n\alpha + \alpha/4$, where n can equal 0, 1, 2, 3 ..., and $\alpha$ is the slot to slot spacing. As the disk rotates past the sensor, TTL level, square wave, output signals are generated in first and second channels, with the signals in the second channel being 90° out-of-phase with those in the first channel.

The above disk fabrication process for a high resolution encoder disk is more expensive than metal stamping or plastic injection molding of a low resolution disk. Also, a U-shaped sensor structure positioned on opposite sides of the motor-driven disk precludes including the emitter/detector as part of an adjacent printed circuit board (PCB), as well as requiring separate connections for the encoder channels and power. These connection costs are a not insignificant part of the encoder cost. Moreover, in high resolution applications such as the described mail machines, the high resolution encoder disk is typically mounted after the motor driver PCB, making field service replacement of the PCB mounted electronics beneath the encoder disk impractical. Still further, in this arrangement, the motor shaft must traverse the PCB, which leaves less room for electrical components.

SUMMARY OF INVENTION

An object of the invention is an optical encoder for a motor-driven positioning system that can be manufactured at a relatively low cost.

A further object of the invention is an optical encoder employing a disk that can be manufactured by low-cost, low resolution methods, such as metal stamping or plastic injection molding, and yet is capable of providing high-resolution performance.

Still another object of the invention is an optical encoder for a brushless DC motor in which the optical sensors as well as the motor driver electronics can all be mounted on the same PCB.

These and other objects and advantages are achieved, in accordance with one aspect of the invention, by employing reflective sensors. By a reflective sensor is meant an emitter and a detector alongside one another, rather than in the U-shaped configuration as has been used in the prior art encoders. A rotating medium is provided adjacent the sensor such that the sensor "sees" a pattern of relatively reflective and non-reflective areas, so that the detector can detect radiation emitted by the emitter and reflected off the reflective areas as the medium rotates by the sensor.

In accordance with a further aspect of the invention, the medium comprises two members, one stationary and the other a disk rotating with the motor. The rotating disk is positioned and rotates between the stationary member and the sensor. In a preferred embodiment, a track of reflective/non-reflective areas on the stationary member is aligned with a track of spaced radiation transparent areas on the rotating disc, so the sensor sees a pattern of reflective areas through the rotating windows of the radiation transparent areas.

In accordance with still another aspect of the invention, the stationary member is mounted directly to the motor housing at an end through which the motor shaft emerges, the rotating disk is mounted on the shaft over the stationary member, and a fixed PCB, which can also be mounted on the motor, is positioned over the rotating disk, with the PCB supporting the optical sensor or sensors, as well as the motor drive circuitry.

A further feature of the invention is the provision of multiple track segments on the encoder, displaced by a fraction of an encoder cycle. This allows relative positioning information of the motor shaft to be obtained with direction and increased resolution.

In accordance with a preferred embodiment, the optical encoder includes two tracks, each associated with its own sensors. One track is used for position-sensing, and the other track is used for commutation. All the sensors are of the reflective type, and all are mounted on the side of the PCB facing the motor.

The operation of the optical encoder of the invention is somewhat different from that of the known encoders using transmission In the latter, the detector typically sees the radiation from the emitter passing through a single slot, producing the square wave signals previously described. The reflected radiation detected in the present invention is more widespread, and is not as sharply defined. Hence, the signal generated by the detector is more like a sine wave, rather than a square wave, superimposed on a general low light level background. Thus, signal conditioning may be required to convert that output into the conventional square wave signals, especially if it is desired to retain the conventional processing circuitry for furnishing the positional and commutating information to the controlling microprocessor.

The invention will now be described in greater detail with respect to several embodiments taken in conjunction with the accompanying drawings.

DETAILED DESCRIPTION OF PREFERRED EMBODIMENT

Figure 1:
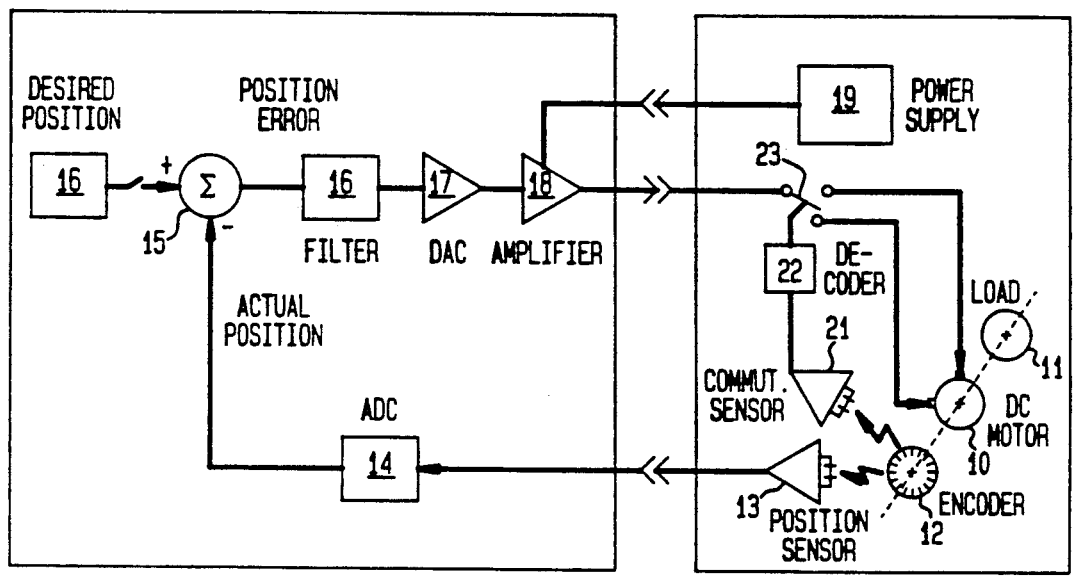
FIG. 1 is a block diagram of a typical closed loop system for energizing a brushless DC motor.

FIG. 1 shows a typical prior art closed loop system for driving a brushless DC motor. The motor is shown schematically at 10 at the right with several contacts representing terminals for a multi-phase stator which cooperates with a permanent magnet rotor. The dashed line shows the coupling of the DC motor shaft to a load 11 on one side and on the opposite side to an optical encoder disk 12. The disk 12 has both an outer encoder track and an inner commutation track each cooperating with its respective sensors. The position sensor for the outer encoder track is connected to an amplifier 13 which then generates an electrical signal which is inputted to an analog to digital convertor 14 and its digital output is inputted to a summer 15. Summer 15 also receives an input from a block 16 which represents the desired position. Typically the information provided by block 16 would be a certain number of counts of the encoder slots. Should the actual position or count derived from the analog-to-digital convertor 14 differ from the desired position inputted from the block 16, the summer 15 generates a position error signal which is typically filtered 16, inputted to a digital-to-analog convertor 17 whose output is amplified 18 powered from power supply 19, and that output is sent to a switch 23. Meanwhile, the inner commutator track slots have been sensed and amplified 21 and inputted to a decoder 22 and the output from the decoder controls the position of the switch 23 to ensure that the error-controlled drive current is passed through the appropriate winding of the multi-phase stator of the motor to tend to drive the shaft to the desired position. This system is described in more detail in the above-identified related applications, Ser. Nos. 423,330 and 423,822.

The present invention relates to an improved optical encoder. It can be used not only in the system described in connection with FIG. 1 but also in many other applications whether closed loop or open loop, whether used for mailing machines or in other applications.

Figure 2:
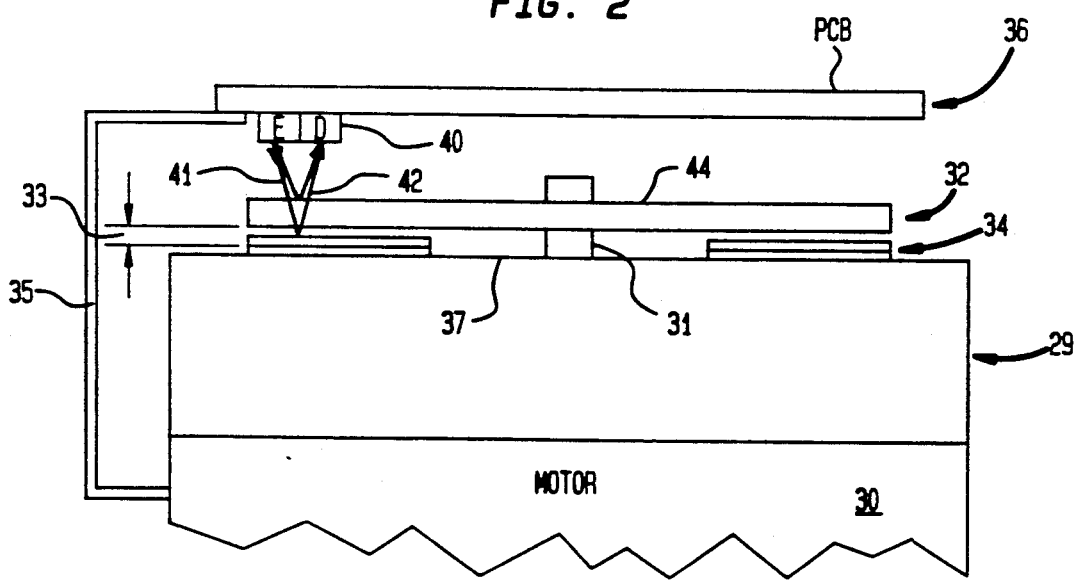
FIG. 2 is a schematic view illustrating one form of the improved optical encoder system of the invention.

FIG. 2 is a schematic view of the improved optical encoder system. The system is schematically illustrated by a part of the motor designated 30 having an output shaft 31. On the output shaft mounted for rotation therewith is an optical encoder disk 32. The encoder disk 32 is spaced by a certain distance indicated by 33 from the flat top of a so-called motor plastic end bell 29, which is conventionally applied and mounted on the motor housing and serves among other things to thermally isolate the optical and electronic components above it from the heat generated by the motor. Mounted by a support shown schematically at 35 is a printed circuit board (PCB) 36 which supports the circuitry or most of the circuitry illustrated in FIG. 1 which provides the motor drive for the DC motor. The PCB 36 is mounted parallel to and in a fixed position relative to the encoder disk 32 and the flat surface 37 of the motor end bell 29. The driver circuitry, which is not shown, is typically provided on the upper surface of the PCB, though space is available for some of the circuitry at the lower surface. The motor shaft 31 ends below the PCB 36. Also mounted on the lower surface of the PCB is a reflective sensor 40. The reflective sensor 40 is a conventional off-the-shelf component which is described in more detail in the referenced related commonly-owned U.S. applications Ser. Nos. 291,092 and 291,473, whose contents are hereby incorporated by reference. It basically consists of a small emitter (labelled E in the drawings) of radiation, typically an LED that radiates infrared radiation, positioned next to and alongside of a photodetector (labelled D in the drawings), typically a phototransistor. The active windows through which the emitter emits radiation shown by the arrow 41 and through which the detector detects reflected radiation indicated by the arrow designated 42 both lie in the same plane facing in the same direction, in this particular instance facing downward toward the encoder disk 32. The spacing is such that radiation from the emitter which is sufficiently reflected from the structures below will be detected by the detector part of the sensor creating an electrical signal which can be processed in the same manner as described in connection with FIG. 1, with some minor exceptions which will be explained in greater detail below.

Mounted in a stationary position on the motor end bell 29 is a stationary pattern 34, referred to from time to time as a disk, which contains reflective and non-reflective areas. Alternatively, the stationary pattern can be imprinted on a stationary disk mounted under the movable disk 32 and of about the same diameter.

Figure 5A:
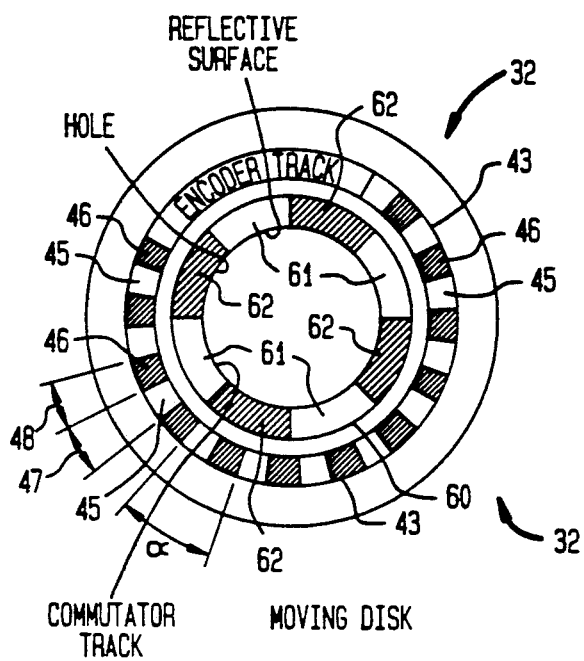
FIG. 5a is a plan view of the moving disk illustrating the layout of the commutator track relative to the encoder track.

The encoder disk 32 in one embodiment has an outer track 43 (FIG. 5A) which contains a uniform pattern of reflective areas and holes or openings or transparent windows which allows radiation to pass through. If the disk 32 is made of plastic, then a suitable reflective material can be coated onto the surface 44 facing the sensor 40. If the moving disk is made of a reflective metal, no reflective coating may be required. In FIG. 5A, which is a plan view of the surface 44 of the encoder disk 32 that faces the emitter 40, the reflective surfaces are indicated by the blank areas designated 45 and the holes are designated by the cross-hatched areas designated 46. The widths of the reflective areas 45 and the holes 46, represented, respectively, by the numerals 47 and 48 in FIG. 5, are the same. Alternatively, the whole surface 44 of the moving disk 32 facing the sensor 40 can be coated with a reflective surface and the holes provided at the places indicated at 46 in FIG. 5A. In any event, the combined width of the adjacent hole and reflective areas represents one encoder cycle designated o in FIG. 5A and corresponds to the same symbol α used above in connection with the description of the prior art system. As the moving disk 32 rotates under the sensor 40, radiation from the emitter will pass through to the stationary pattern 34 located below when or each time that a hole 46 is aligned with the sensor.

Figure 3:
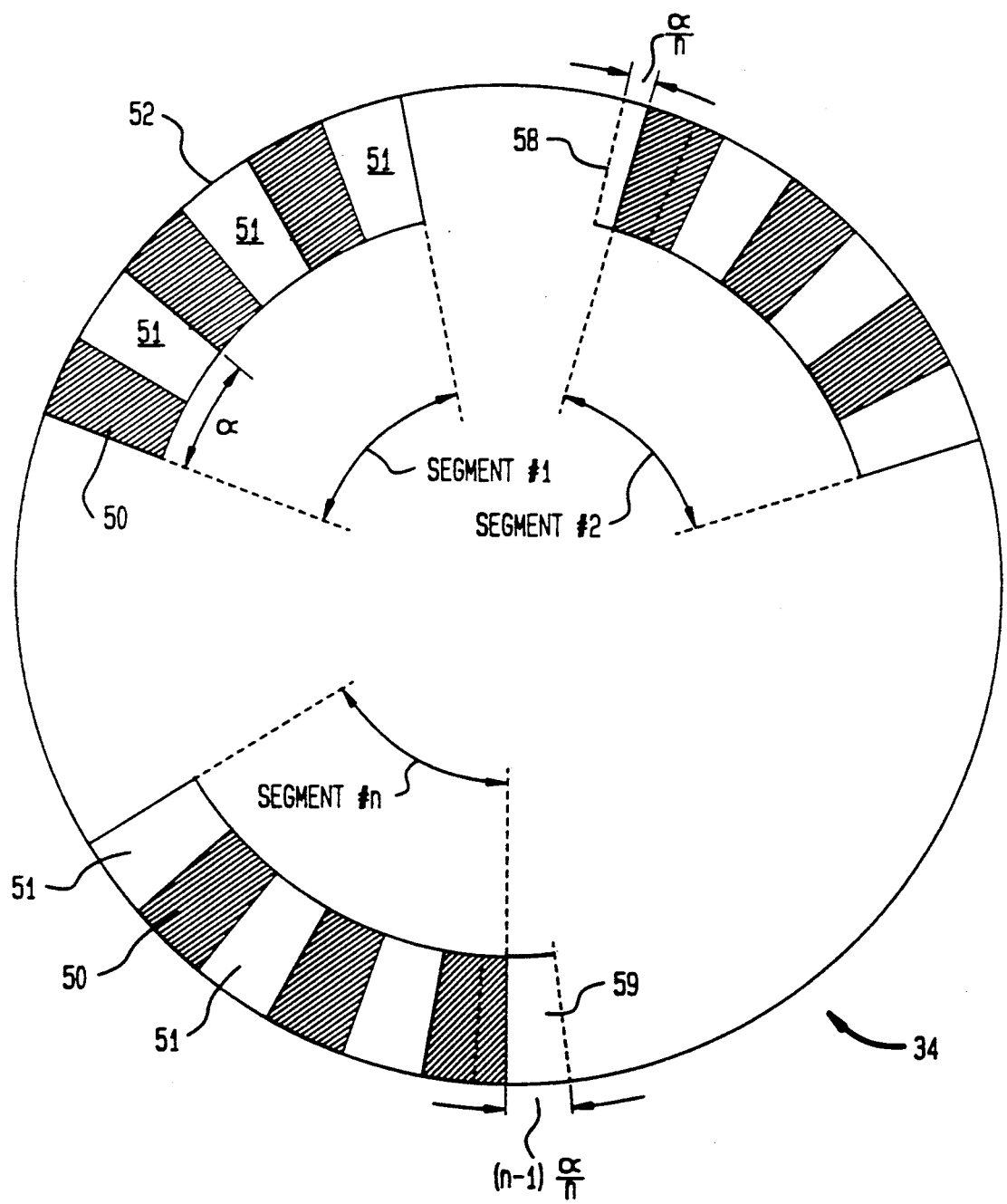
FIG. 3 is a plan view of the stationary encoder track pattern of the encoder of FIG. 2 showing the position-determining or encoder outer track only.

A top plan view of the stationary pattern 34 which faces the sensor 40 is illustrated in FIG. 3. It contains a series of non-reflective areas designated by cross-hatching and represented by reference numeral 50 adjacent reflective surfaces which are shown clear on the drawing and designated 51. This outer track 52 of the pattern is divided up into three segments designated Segment #1, Segment #2, and Segment #n. This provision of multiple segments of the non-reflective/reflective pattern 52 on the stationary disk 34 is used to sense rotation direction and increase resolution. As with the movable disk 32, the width of the reflective and non-reflective areas 51 and 50 on the stationary pattern is the same. Similarly, an adjacent pair of non-reflective 50 and reflective areas 51 are designated in FIG. 3 by the symbol α representing one encoder cycle α. Thus, over one cycle of the stationary encoder track 52, one half of a cycle is coated with reflective material while the other half is given a non-reflecting coating. Actually, if the stationary pattern is formed by a plastic overlay, the non-reflective areas 50 need not be provided with a specific non-reflective or anti-reflective coating, since the plastic-air interface typically reflects only a nominal four percent of incident radiation from the LED.

Figure 4A:
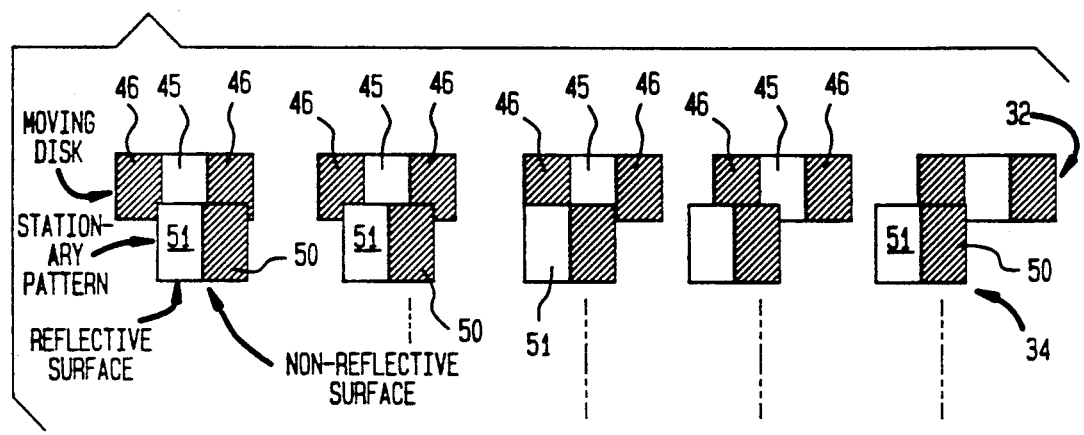
FIGS. 4A, B, and C show, respectively, at the top the positions of the reflective and non-reflective surfaces on the moving disk and stationary pattern of the optical encoder of FIG. 2 together with several waveforms of output signals.
Figure 4B:
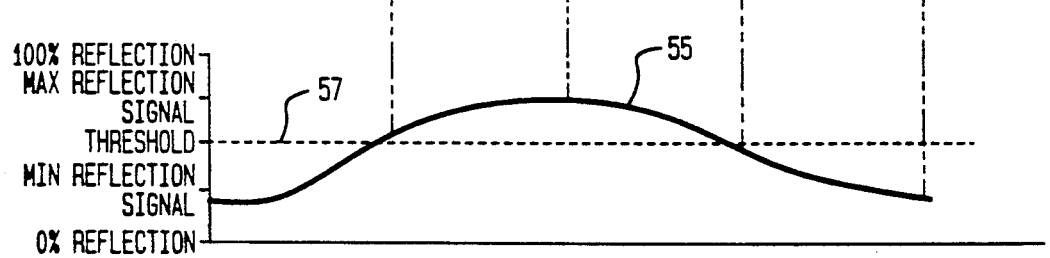
Figure 4C:
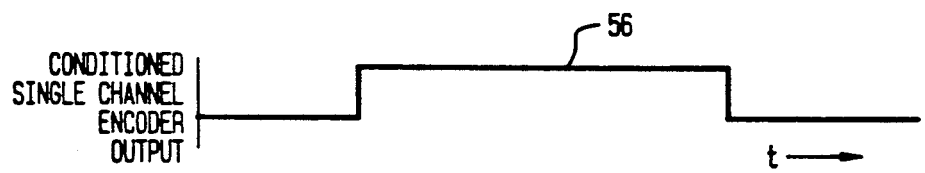

FIG. 4A illustrates the operation with the same cross hatched and non-cross hatched areas representing the same surface conditions as in FIGS. 3 and 5. In operation, as the moving disk 32 rotates between the stationary pattern 34 and the fixed sensor 40, the reflective sensor 40 sees a reflective surface varying between 50 percent to 100 percent of the total surface visible to it. The detection voltage or the signal output by the detector output signal is shown at 55 in FIG. 4B. As will be observed, when a hole 46 on the moving disk 32 is present under the sensor 40 while a non-reflective surface 50 on the stationary pattern 34 is also present, shown at the left and right ends of the curve 55 in FIG. 4, then the detector output is a minimum. The detector output is a maximum, when a hole 46 in the moving disk 32 is aligned with a reflective surface 51 on the stationary pattern, which is illustrated at the center of the curve 55 of FIG. 4B.

It is desirable to be able to use the same electronics as is conventionally used in such closed-loop systems, for which purpose the signal to be processed should have a square waveform. This is readily accomplished by providing conventional conditioning circuitry to convert the sinusoidal signal indicated at 55 into the square-wave signal indicated below at 56 by employing, for example, a standard Schmidt trigger circuit biased to trigger when the sinusoidal signal voltage passes a predetermined threshold 57 which is approximately 30 to 60 percent of the amplitude range between its maximum and minimum signals. The way of implementing this will be obvious to those skilled in the art.

In the embodiment so far described, the moving disk 32 contains a reflective surface with a pattern of radiation transparent windows cooperating with a stationary pattern consisting of reflective and non-reflective areas to produce a generally sinusoidal signal which varies between approximately 50 percent to 100 percent of the total visible surface seen by the sensor. The same results can be accomplished, alternatively, with a moving disk which is primarily non-reflective with holes in the same pattern as indicated previously, cooperating with a stationary pattern which employs adjacent reflective areas and holes, which latter holes correspond to the non-reflective areas 50 at the positions of the previous embodiment. In this case, the outputted sinusoidal signal will vary between 0 and approximately 50 percent of the visible surface, but it nevertheless can be processed in exactly the same manner to produce the conditioned outputs in a single channel for driving the closed-loop system.

The benefits of the system of the invention is that reasonably high resolution with the encoder disk of the invention is obtained even though it can be manufactured by an inherently low resolution fabrication process as previously described. Another important benefit is that the sensors can be mounted on the outer fixed PCB and thus are readily accessible for field servicing. Moreover, accuracy constraints on the location of the sensors are lower. Also, more PCB space is available for circuitry. The same applies to the circuitry present on the PCB. Finally, the cost of the system is relatively small, as these reflective type sensors are relatively inexpensive.

The multiple segments on the stationary pattern described above function to sense direction of rotation of the motor shaft and to increase encoder resolution. When n separate segments are used, three of which are shown in the example illustrated in FIG. 3, each segment is displaced a circumferential distance a/n from each adjacent segment. The dashed line 58 in FIG. 3 represents what may be termed the virtual location of the Segment #1 trace to illustrate the displacement for the second segment, and dashed line 59 shows the virtual location of the #1 segment for the nth segment. The maximum number of segments used will generally be limited by the electronic jitter that may result due to too close spacing versus the available detector transition window. A minimum of two segments are required for direction sensing. A sensor 40 is mounted over each segment, so that the signal generated by each is slightly out of phase with that of the adjacent sensor. Processing of these out-of-phase signals is what gives the direction and increased resolution. In effect, each segment composed of a plurality of reflective 51 and non-reflective 50 areas, three each in the FIG. 3 example, together with its sensor generates an independent signal characterized by transitions one cycle wavelength apart. The slight displacement of the segments means that the respective transitions will be displaced by a fraction of a wavelength. So, with two segments, a one-half cycle displacement can occur, and with three segments a one-third cycle displacement. The precise amount of displacement is not critical, so long as the resultant signals can be identified and processed by appropriate logic circuitry into control signals for the motor. In the simplest arrangement, the segments could be evenly distributed around the track. The resultant encoder resolution will be two times n times the moving disk counts per revolution, where n is the number of distinct segment groups in the stationary pattern of FIG. 3. Standard circuitry, encoded in a programmable array semi-conductor device, can be used to decode the output to provide incremental rotary position and rotation direction.

Figure 5B:
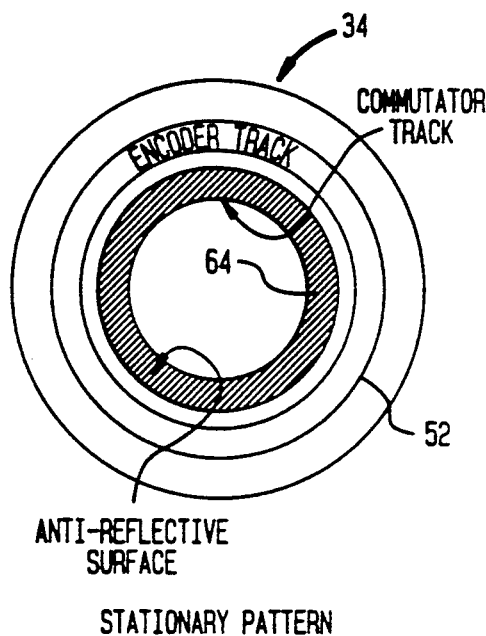
FIG. 5b is a corresponding view of the commutator track on the stationary pattern.
Figure 6:
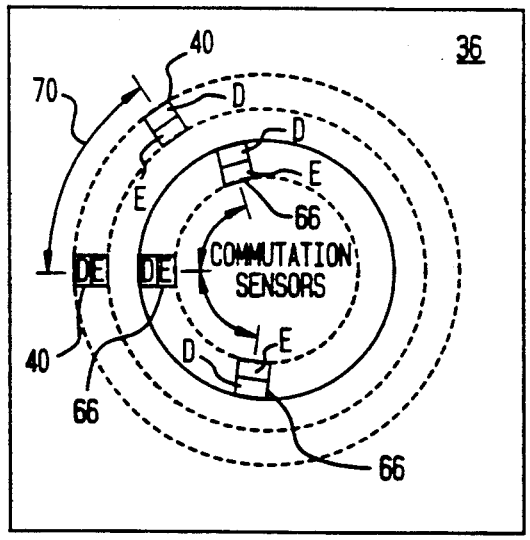
FIG. 6 is a bottom plan view of the motor driver PCB showing the positions of the encoder and commutation sensors.
Figure 5C:
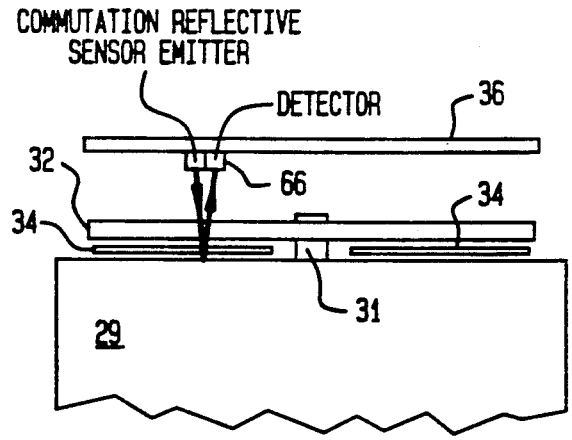
FIG. 5c is a view similar to FIG. 2 illustrating the location of the sensor for the commutator track.

A feature of the invention is that a commutation track for the brushless motor can very easily be incorporated on the same encoder structure. This is illustrated in FIGS. 5 and 6. A commutation track 60 is provided on the moving disk 32 inside of the encoder track 43. Four 45° arc cut-out segmented holes represented by the hatched areas 62 are provided on the reflective surface 44 of the moving disk 32. These cooperate with and are complemented by a non-reflective annular region 64 on the stationary pattern 34, represented by the hatched area in the form of a circular track inside of the encoder track in FIG. 5B. The commutation system employs three reflective optical sensors 66 located on the printed circuit board 36 adjacent the encoder track sensors 40. FIG. 5C is a view similar to FIG. 2 showing one of the sensors 66 for the commutator track. A bottom view of the PCB 36 showing the relative positions of both the encoder track sensors 40 and the commutator track sensors 66 is given in FIG. 6. Three reflective sensors 66 are used for a three-phase brushless DC motor. If fewer or a greater number of phases or windings were present, then one sensor would have to be provided for each of the phases. Suitable circuitry is connected to these commutator sensors 66 to generate the necessary commutation logic signals, which can be the identical circuitry used in the prior art systems but again with the modification of the signal conditioning to produce the desired square wave signals for convenient processing. For completeness' sake, the spacing 33 in FIG. 2 between the movable disk 32 and the stationary pattern 34 preferably ranges between 0.010 and 0.015 inch, to ensure adequate reflection in a well-defined manner as the moving disk rotates.

In the mailing machine application previously described, the close coordination of the various stations which process the mail is important. Typically, separate motors are used for the transport inside of each station and on occasion between stations. When the system is designed to process mail at high speed, accurate positioning of the mailpieces is necessary. Moreover, many of the motors are not on continuously but are constantly starting up and stopping. When the motor starts up from a previous stopped position, it is important in this application to know the absolute position of the shaft. There are sensors in the machine bed which sense the presence of a mailpiece and a microprocessor is then activated to use that information to start up downstream motor transports so that they will be up to speed at the time the mailpiece being processed arrives. While, in principle, the system of the invention using reflective sensors can operate with just the moving disk alone provided with a desired pattern of reflective and non-reflective areas, the provision of the stationary pattern beneath has the advantage that the combination of the patterns represented by the reflected signals enables a much more accurate relative position of the motor shaft to be derived. Hence, with such a system, if it is possible to know the precise position of the motor shaft in a stopped condition, when it is started up and operated and moved to a new position, over perhaps many revolutions, one will still know when it is finally stopped exactly how many full and part revolutions has taken place based upon the count of the square wave pulses 56 depicted in FIG. 4C. This greatly simplifies the processing and the tracking of the various mail processing stations because the coordination can be based on the bed sensor trigger pulse and the number of counts representing the difference between the old and new rotor positions of the motor. For this reason also the second set of phase-displaced signals in a second channel from the encoder track 52 are necessary and are processed in a manner similar to the prior art system. Thus, for the encoder track 43, assuming two segments, two separate sensors 40 shown in FIG. 6 would be provided, with the circumferential spacing 70 substantially equal to $I\alpha + \alpha/n$, where I is an integer, and n is the number of segments, here equal to 2. Thus, the output from the leading sensor will be in-phase, and the output from the trailing sensor will be out-of-phase by 90 degrees for this two-segment system as in the conventional system. In a practical embodiment, with a 10 mil width of the reflective and non-reflective areas, it is possible to obtain a resolution equal to two hundred and fifty counts per motor shaft revolution. This is remarkably high, considering the low-resolution fabrication methods for both the moving disk and the stationary pattern. The presence of these three commutation sensors as given in the example serves, as indicated above, to drive the three windings of a conventional 3-phase motor.

While the invention has been described and illustrated in connection with preferred embodiments, many variations and modifications as will be evident to those skilled in this art may be made therein without departing from the spirit of the invention, and the invention as set forth in the appended claims is thus not to be limited to the precise details of construction set forth above as such variations and modifications are intended to be included within the scope of the appended claims.

What is claimed is:

1. In a motor-driven positioning system having a current-driven brushless DC motor provided with an optical encoder furnishing first electrical signals for determining rotor position and furnishing second electrical signals for commutating the motor drive current, the improvement comprising the optical encoder having a pattern of relatively reflective and non-reflective areas,
a plurality of radiation emitter and detector means positioned such that radiation from at least one of said plurality of respective emitter means reflected from the reflective areas is detected by at least one of said plurality of respective detector means, and means connected to the detector means for deriving at least one of the first and second electrical signals from the detected radiation reflected from the detected areas, said optical encoder having a stationary pattern and a moveable disk located between said plurality of radiation emitter and detector means and the stationary pattern.

2. The system of claim 1, wherein the stationary pattern comprises a first track of adjacent reflective and non-reflective areas.

3. The system of claim 2, wherein the first track is divided into plural segments, each slightly displaced from the adjacent segment.

4. The system of claim 1, wherein the movable disk comprises a first track pattern of holes.

5. The system of claim 1, wherein the movable disk has a reflective surface with a pattern of holes.

6. The system of claim 5, wherein the movable disk has surface with a pattern of holes.

7. The system of claim 1, further comprising means for deriving both the first and second electrical signals from the detected radiation.

8. The system of claim 7, wherein the encoder comprises a stationary pattern arranged in first and second tracks, and a movable disk having first and second tracks of patterned holes.

9. The system of claim 8, wherein the motor has an end bell, and the stationary pattern is on the end bell.

10. The system of claim 9, further comprising a PCB supporting motor drive circuitry mounted on the side of the encoder remote from the motor, said radiation emitter and detection means being mounted on said PCB.

11. The system of claim 1, wherein at least one of the moving disk and stationary pattern comprises separate encoder and commutation tracks for deriving said first and second electrical signals, respectively, the encoder track comprising pairs of light-affecting and non-light affecting areas each having a width of one encoder cycle $\alpha$.

12. The system of claim 1, wherein at least two of said plurality of radiation emitter and detector means are provided for the encoder track, each located over a segment of the stationary pattern displaced from an adjacent segment by $I\alpha + \alpha/n$, where I is an integer, and n represents the number of distinct segments in the pattern.

13. A motor-driven positioning system comprising:
(a) a brushless DC motor having a rotor whose position is to be set,
(b) electronic driving means connected to the motor for operating same to change the position of its rotor,
(c) an optical encoder connected to and rotatable with the rotor, said optical encoder comprising a member having first and second sides and having on said first side a pattern of relatively reflective and non-reflective areas,
(d) first means adjacent said first side of the encoder member for directing thereon a beam of radiation capable of reflection from said reflective areas,
(e) second means adjacent said first side of the encoder member for detecting radiation from said first means reflected from said reflective areas and converting same to electrical signals,
(f) third means for processing said electrical signals to determine whether the rotor is at a desired position,
(g) fourth means connected between said third means and said electronic drive means for providing the latter with driving signals to cause the rotor to rotate to the desired position, and
(h) fifth means for processing said electrical signals to provide commutation for the electronic drive means wherein said optical encoder having a moveable disk with patterned holes rotating between a stationary pattern of relatively reflective and non-reflective areas and the first and second means.

* * * * *